United States Patent [19]

Lundy et al.

[11] Patent Number: 5,320,933

[45] Date of Patent: Jun. 14, 1994

[54] PHOTOIMAGEABLE COMPOSITION HAVING IMPROVED ADHESION PROMOTER

[75] Inventors: Daniel E. Lundy, Pomona; Robert K. Barr, Laguna Niguel; James G. Shelnut, Lake Forest, all of Calif.

[73] Assignee: Morton International, Inc., Chicago, Ill.

[21] Appl. No.: 979,349

[22] Filed: Nov. 20, 1992

Related U.S. Application Data

[63] Continuation of Ser. No. 676,720, Mar. 28, 1991, abandoned, which is a continuation-in-part of Ser. No. 503,204, Mar. 30, 1990, abandoned.

[51] Int. Cl.$^5$ .................................. G03C 1/73
[52] U.S. Cl. ............................ 430/283; 430/288; 430/954
[58] Field of Search .............. 430/281, 283, 277, 275, 430/954, 288; 522/12, 14

[56] References Cited

U.S. PATENT DOCUMENTS

| | | | |
|---|---|---|---|
| Re. 33,108 | 11/1989 | Ishikawa et al. | 430/313 |
| 3,620,732 | 11/1971 | Steppan et al. | 430/283 |
| 3,887,450 | 6/1975 | Gilano et al. | 522/8 |
| 4,228,232 | 10/1990 | Reusseau | 430/281 |
| 4,233,395 | 11/1980 | Klüpfel et al. | 430/954 |
| 4,578,342 | 3/1986 | Sekiya | 430/275 |
| 4,610,951 | 9/1986 | Lipson et al. | 430/313 |
| 4,713,298 | 12/1987 | Hong et al. | 430/275 |
| 4,952,481 | 8/1990 | Seio et al. | 430/284 |

FOREIGN PATENT DOCUMENTS 2448821  4/1976  Fed. Rep. of Germany ...... 430/277

Primary Examiner—Christopher Rodee
Attorney, Agent, or Firm—Wayne E. Nacker; Gerald K. White

[57] ABSTRACT

A photoimageable composition contains from 0.5 to 5 wt. percent of a compound of the formula:

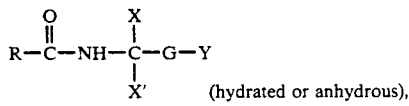

(hydrated or anhydrous), wherein
R = alkyl, aryl, aralkyl, alkenyl, alkynyl, and substituted forms thereof
X = OR', SR', NR'$_2$, R'
R' = H, R, CO—R,
G = nothing or C$_1$–C$_8$ alipathic hydrocarbon, and
Y = COOH, PO$_3$H, SO$_3$H, SO$_2$H and SOH. X' = R' to promote adhesion of the photoimageable composition to metal.

5 Claims, No Drawings

PHOTOIMAGEABLE COMPOSITION HAVING IMPROVED ADHESION PROMOTER

This is a continuation of co-pending application Ser. No. 07/676,720 filed on Mar. 28, 1991 now abandoned, which in turn is a continuation-in-part of Ser. No. 07/503,204 filed Mar. 30, 1990, now abandoned.

The present invention is directed to photoimageable compositions, such as are used for manufacture of printed circuit boards and for forming solder masks which cover printed circuit boards. In particular, the present invention is directed to photoimageable compositions using a novel adhesion promoter.

BACKGROUND OF THE INVENTION

Photoimageable compositions are used for various purposes in the manufacture of printed circuit boards or the like. Photoimageable compositions in the form of a primary imaging photoresist are used in the formation of the printed circuitry itself. In a typical procedure, a panel for forming a printed circuit board comprises a thin layer of metal, e.g., copper, covering a non-conductive substrate. A layer of photoresist is applied over the metal layer. The photoresist is exposed to patterned actinic radiation, e.g., by passing illumination through artwork having an opaque/transparent pattern. The exposed photoresist is then developed by exposure to a solution or solvent which, depending upon the type of photoresist, washes away either the exposed or unexposed portion of the photoresist, leaving a patterned layer of either unexposed or exposed photoresist. The panel can then be etched with a solution which removes the metal layer from those portions of the plate from which photoresist has been removed. Subsequent to etching, the remaining photoresist layer is generally stripped away. Alternatively the panel can be pattern plated, whereby the areas devoid of photoresist are electrolessly or electro-chemically plated with copper or the like, the resist is stripped, as above-mentioned, and the newly exposed areas are then removed by etching. leaving behind the pattern plated areas.

Other photoimageable compositions are used for forming solder masks in a similar manner. Such a composition is used to form a hard, permanent layer which overlies printed circuitry except in those portions of the printed circuitry to which solder is to be applied.

Photoimageable compositions may be applied to a panel in liquid form and then either allowed to dry or to partially cure so as to form a semi-stable layer.

Alternatively, the photoimageable composition may be used to form a dry film comprising a layer of photoimageable composition on a cover sheet of support material. The layer of photoimageable material is subsequently transferred from the support sheet to a surface of the panel board.

Dry films comprise the layer of photoimageable material and the cover sheet of support material. The support material is somewhat flexible but has sufficient rigidity to provide structure to the layer of photoimageable material. Typically the cover sheet is formed of a polyester, such as polyethylene terephthalate (PET), such as that sold as MELINEX[R]. As the photoimageable layer is to be transferred from the cover sheet, a release agent may be applied to the surface of the cover sheet which carries the photoresist layer. It is typical to also provide a protective sheet, e.g., a sheet of polyethylene, on the surface of the photoimageable layer opposite the cover sheet The protective sheet, in addition to protecting the photoimageable layer, better enables the dry film to be rolled into a reel. The protective sheet is removed from the photoresist layer prior to application of the dry film to the circuit board. U.S. Pat. No. 4,530,896 and U.S. patent application Ser. No. 07/210,194 filed Jun. 20, 1988 the teachings of each being incorporated herein by reference, describe dry films in which a top coat is interposed between the cover sheet and photoimageable layer, which top coat is selectively adherent to the photoimageable layer (relative to its adherence to the cover sheet). The top coat serves to protect the photoimageable layer from mechanical damage and from oxygen after removal of the cover sheet prior to exposure to patterned actinic radiation. Other examples of dry films can be found in U.S. Pat. Nos. 3,887,450, 4,539,286 and 4,610,951, the teachings of each being incorporated herein by reference.

The present invention is generally directed to photoimageable compositions and dry films formed therefrom which are used in the manufacture of printed circuit boards, including those in which the photoimageable composition is a primary imaging photoresist and those in which the photoimageable composition is a solder mask-forming composition. The invention is applicable to dry films in which the photoimageable layer is in direct contact with the cover sheet (in which case the photoimageable layer is generally exposed through the cover sheet) and those in which a top coat is interposed between the photoimageable layer and the cover sheet (in which case the cover sheet is generally removed prior to exposure of the photoimageable layer).

A most important property of any photoimageable composition to be applied to a metallic surface (generally copper of a board is the degree of adhesion that the photoimageable composition has to the metal. Many defects in printed circuit board manufacture can be attributed to inadequate adhesion of the photoimageable composition to the metal. It is known to add agents to photoimageable compositions for the specific purpose of enhancing adhesion of the photoimageable composition to metal surfaces. Prior art adhesion promoters include diacetone acrylamide (DAA) and isobutoxy methyl acrylamid (IBMA).

There exists a need for improved adhesion promoters, and the present invention is directed to photoimageable compositions having agents which promote their adhesion to metal surfaces.

SUMMARY OF THE INVENTION

To a photoimageable composition to be applied to a metallic surface, particularly a copper surface, is added between about 0 5 wt percent and about 5 wt percent (relative to total solids) of a compound having the general formula:

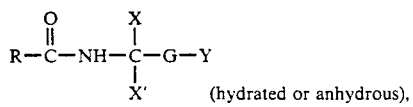 (hydrated or anhydrous), wherein
R = alkyl, aryl, aralkyl, alkenyl, alkynyl, and substituted forms thereof
X = OR', SR', NR'$_2$, R'
R' = H, R, CO—R, G = nothing or Chd 1-C$_8$ alipathic hydrocarbon, and
Y = COOH, PO$_3$H, SO$_3$H, SO$_2$H and SOH.
X' = R'

DETAILED DESCRIPTION OF CERTAIN PREFERRED EMBODIMENTS

The adhesion promoters used in accordance with the present invention are believed to be generally useful in photoimageable compositions that are to be applied to a metal surface, such as a metal-clad board from which a circuit board is printed, or a surface which is partially metal, such as a printed circuit board having metallic traces on non-conductive material The photoimageable compositions may be primary photoresists or photoimageable compositions useful for forming hard, permanent masks, such as solder masks The photoimageable compositions may be solvent-developable or soluble in aqueous or semiaqueous solutions.

A photoimageable composition (negative-acting) contains photopolymerizeable or photo cross-linkable substance. In most cases, the primary photopolymerizeable material is a monomer or mixture of monomers The photopolymerizeable material may be or may include dimers or short-chain oligomers. In connetion with photopolymerizeable monomers and short-chain oligomers, it is the usual practice to provide a binder comprising pre-formed polymeric material The binder polymeric material may or may not enter into the polymerizeable reaction Less commonly, a pre-formed polymeric material may serve as a binder and be photocrosslinkable.

In another type of photoimageable composition (positive-acting) a polymeric network is formed which is insoluble in a developer and the polymeric network is photodegradeable to become soluble in the developer.

Particular advantages of the adhesion promoters of the present invention are with respect to their inclusion in photoimageable compositions of the negative-acting type which contain a binder polymer having free carboxyl groups and which are therefore developable in basic aqueous or semi-aqueous solutions. Examples of such polymers are found, in the following U.S. Pat. Nos.: 4,615,950; 3,359,129; 3,526,504; 3,980,483; 4,025,407; 4,210,449; 4,260,675; 4,268,614; 4,289,845; 4,413,052; 4,451,523; 4,465,760; 4,528,261; 4,296,196; 4,361,640; 4,250,248; 3,953,309; 3,376,138; and 4,239,849. In addition to the binder polymer, a photoimageable composition to which the invention is applicable includes a monomer or monomers which upon photoinitiation react with and cross-link the polymer, usually by a free-radical reaction The composition also includes a photoinitiator which is sensitive to light and which upon exposure to light generates a species, e.g., a free radical, that initiates the cross-linking reaction. The cross-linking reaction renders those portions of the photoimageable composition exposed to light insoluble in aqueous or semi-aqueous developers, while the unexposed portions of the photoimageable compositions are soluble in basic aqueous or semi-aqueous developer solutions. (By semi-aqueous solution is meant herein a solution which is about 90% or more by volume aqueous solution, balance an organic solvent such as alcohols, ethers, glycols, esters, ketones, glycol ethers and the like.)

For aqueous developability, the binder polymer preferably has an acid number between about 80 and about 250. The carboxylic acid-containing binder polymer is formed from monomers that include alpha, beta ethylenically unsaturated carboxylic acids and anhydrides, such as acrylic acid, methacrylic acid and maleic anhydride. The polymeric binder may, and generally is, formed from additional comonomers, including esters of acrylic acids, such as methyl acrylate, methyl methacrylate, hydroxy ethyl acrylate, butyl methacrylate, octyl acrylate, 2-ethoxy ethyl methacrylate, t-butyl acrylate, 1,5-pentanediol diacrylate, N,N-diethylaminoethyl acrylate, ethylene glycol diacrylate, 1,4-butanediol diacrylate, diethylene glycol diacrylate, hexamethylene glycol diacrylate, 1,3-propanediol diacrylate, decamethylene glycol diacrylate, decamethylene glycol dimethacrylate, 1,4-cyclohexanediol diacrylate, 2,2-dimethylol propane diacrylate, glycerol diacrylate, tripropylene glycol diacrylate, glycerol triacrylate, trimethylolpropane triacrylate, pentaerythritol triacrylate, 2,2-di(p-hydroxy-phenyl)-propane diacrylate, pentaerythritol tetracrylate, 2,2-di(p-hydroxyphenyl)-propane dimethacrylate, triethylene glycol diacrylate, polyoxyethyl-2-2-di(p-hydroxyphenyl)-propane dimethacrylate, triethylene glycol dimethacrylate, polyoxypropyltrimethylol propane triacrylate, ethylene glycol dimethacrylate, butylene glycol dimethacrylate, 1,3-propanediol dimethacrylate, butylene glycol dimethacrylate, 1,3-propanediol dimethacrylate, 1,2,4-butanetriol trimethacrylate, 2,2,4-trimethyl-1,3-pentanediol dimethacrylate, pentaerythritol trimethacrylate, 1-phenyl ethylene-1,2-dimethacrylate, pentaerythritol tetramethacrylate, trimethylol propane trimethacrylate, 1,5-pentanediol dimethacrylate, and 1,4-benzenediol dimethacrylate. Suitable non-acrylate co-monomers which may be incorporated in the binders include, but are not limited to, styrene, vinyl toluene, maleate esters such as dibutyl maleate, vinyl ethers, vinyl ketones, vinyl pyridines and allyl acetoacetates.

The photoimaging system is based upon the polymerizable subtances, particularly alpha, beta ethylenically unsaturated compounds, such as acrylic monomers and oligomers and maleic anhydride. The polymerizable substances are generally monomers containing one or more polymerizable moieties They can, however, contain dimers or trimers of alpha, beta ethylenically unsaturated monomers. Any of the alpha, beta ethylenically unsaturated compounds, listed above, as components of a polymeric binder is suitable as a polymerizable substance for purpose of this invention. Mixtures of polymerizable compounds are also suitable.

Also required in conjunction with the polymerizable monomer(s) is a chemical initiator system which generates free radicals in the presence of actinic radiation and polymerizes the acrylic substance. Polymerization of acrylic monomer units into a three-dimensional structure insolubilizes the photoimageable composition by immobilizing the polymeric binder. The choice of the photosensitive, free radical-generating initiator system is not considered to be critical to the practice of the present invention, and a wide variety of such compounds may be successfully utilized in the practice of this invention. Examples of chemical photoinitiator systems include benzophenone, benzoin ether, benzil ketals and acetophenone and its derivatives. Other suitable initiator systems are described, for example, in U.S. Pat. Nos. 3,469,982, 4,451,523 and 4,358,477, the teachings of which are incorporated herein by reference. The amount of photoinitiator employed may vary over a wide range, depending upon the polymerizable acrylic substance(s), the particular photoinitiator system and the desired time of development.

Because the invention is applicable to a wide variety of photoimageable compositions, the relative percentages of the binder polymer, the monomer(s) and photoinitiator may vary over a wide range. The carboxyl-containing binder polymer may comprise between about 30 and about 80 wt. percent of the solids of the composition, the monomer(s) may comprise between about 15 and about 65 wt. percent of the solids of the composition and the photoinitiator may comprise between about 0.005 and about 5 wt. percent of the solids of the composition. Additionally, the photoimageable compositions may contain a wide variety of additional components as are known in the art, including additional polymers, such as those which might be used to effect a final hardened cure of a solder mask, dyes, stabilizers, flexibilizing agents, fillers etc.

The adhesion promoters of the present invention have the general chemical formula:

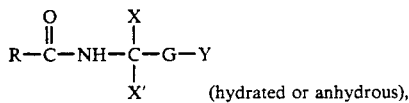

(hydrated or anhydrous), wherein
R = alkyl, aryl, aralkyl, alkenyl, alkynyl, and substituted forms thereof
X = OR', SR', NR'$_2$, R'
R' = H, R, CO—R,
G = nothing or Chd 1-C$_8$ alipathic hydrocarbon, and
Y = COOH, PO$_3$H, SO$_3$H, SO$_2$H and SOH.
X' = R'
Preferably
R = CH$_2$=CH
X' = H
G = nothing
X = OH, and
Y = COOH Specific examples of adhesion promoters in accordance with the present invention are:

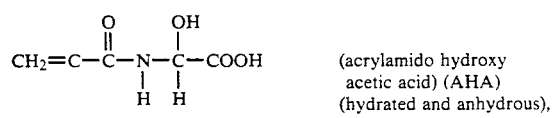
(acrylamido hydroxy acetic acid) (AHA)
(hydrated and anhydrous),

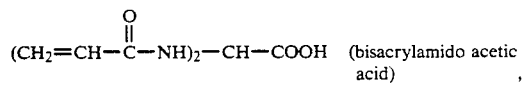
(bisacrylamido acetic acid),

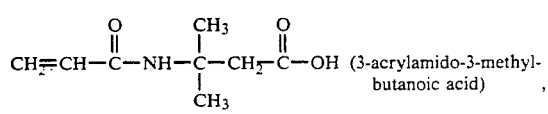
(3-acrylamido-3-methyl-butanoic acid), and mixtures thereof.

The adhesion promoters are used at levels of between about 0.5 and about 5 wt percent of the solids of the photoimageable composition, preferably between about 1 and about 4 wt. percent. They may be used alone or in conjunction with other adhesion promoters known in the art.

The primary advantage of the adhesion promoters of the present invention is the enhanced adhesion between the photoimageable composition and metal, particularly copper. Improved adhesion promotes resolution and results in fewer rejects It is believed that adhesion is promoted by multiple chelation with metal, e g , copper.

For use with aqueous and semiaqueous developable photoimageable compositions, an unexpected additional advantage is a shortening of stripping time. In view of the adhering properties which the adhesion promoters of the present invention exhibit, it is surprising that these agents also promote removal of the photoimageable material after exposure and development Although Applicants are not bound by any theory, it is believed that the combination of —OH and —COOH or other acidic groups of the adhesion promoters enhance the stripping process.

There are additional advantages which are a consequence of the improved strippability imparted by the adhesion promoters of the present invention. Volatile and liquid components heretofore needed to enhance strippability may be eliminated. Elimination of volatiles is, of course, advantageous from an environmental and health and safety point of view. Elimination of liquids from formulations reduces cold-flow, which reduction is particularly important when the photoimageable composition is used as a layer on a dry film. Reduced cold-flow also enhances resolution. Formulation latitude is also enhanced because some substances which inhibit stripping may now be used.

The adhesion promoters of the present invention are also advantageous over DAA and IBMA in that they are less volatile than these prior art adhesion promoters.

Another surprising advantage of the adhesion promoters of the present invention is that they activate color when certain dyes, such as Leuco crystal violet, are incorporated in the photoimageable compositions It is common to utilize a developable dye in the photoimageable composition, whereby the exposed photoimageable composition may be visually inspected for pattern and defects prior to development. It is totally unexpected that the adhesion promoters would enhance color development. The improvement either results in enhanced contrast using a similar amount of dye, or permits the use of less dye.

To the Base Formula set forth below, various amounts of acrylamido hydroxy acid, as set forth above, may be added to improve adhesion, e.g., 0.5 grams, 1.0 grams, 1.5 grams and 2.0 grams.

| BASE FORMLA: | PARTS |
| --- | --- |
| Binder resin: Scripset$^R$ 540 (1:1 styrene:maleic anhydride) | 40 |
| Trimethylolpropane triacrylate (TMPTA) | 12.5 |
| Tetraethyleneglycol diacrylate (TEGDA) | 12.5 |
| Diacetone acrylamide | 4 |
| Benzotriazole | 1 |
| Baso Blue dye | .002 |
| Modaflow$^R$ (flow control agent) | .1 |
| Chlorothioxanthone (photosensitizer) | .5 |
| Ethyldimethylaminobenzoate (photoinitiator) | 1.5 |
| DuPont A022 (antioxidant) | .03 |

While the invention has been described in terms of certain preferred embodiments, modifications obvious to one with ordinary skill in the art may be made without departing from the scope of the invention.

Various features of the invention are set forth in t he following claims.

What is claimed is:

1. In a photoimageable composition applicable to a metal surface which, upon exposure to patterned actinic radiation contains portions which are removable with a developer and portions which are non-removable with a developer, said photoimageable composition comprising a) a carboxyl-containing binder polymer which comprises between about 30 and about 80 wt. percent of the solids of said photoimageable composition, b) a photopolymerizeable monomer which comprises between about 15 and about 65 wt. percent of the solids of said photoimageable composition, c) a photoinitiator which comprises between about 0.005 and about 5 wt. percent of the solids of said photoimageable composition, the improvement wherein the photoimageable composition containing d) in addition to said photoimageable monomer b) and said photoinitiator c) a compound which promotes the adhesion of said photoimageable composition to a metal substrate, said compound d) comprising between about 0.5 and about 5 wt. percent of the solids of said photoimageable composition, said compound d) being of the formula;

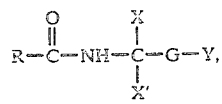

wherein
R = alkyl, aryl, alkenyl, alkynyl, or substituted forms thereof,
X = OR', SR', or NR'$_2$,
R' = H, R, or CO—R
G = nothing or $C_1$-$C_8$ aliphatic hydrocarbon,
Y = COOH, PO$_3$H, SO$_3$H, SO$_2$H or SOH, and
X' = R'.

2. In a photoimageable composition according to claim 1 which said compound d) is selected from acrylamido hydroxy acetic acid, bisacrylamido acetic acid, 3-acrylamido-3-methyl-butanoic acid, and mixtures thereof.

3. In a photoimageable composition according to claim 1 which is developable in alkaline aqueous or alkaline semiaqueous developer.

4. In a photoimageable composition according to claim 1, in said formula, Y being COOH.

5. In a photoimageable composition in accordance with claim 1 wherein said binder polymer has an acid number between about 80 and about 250.

* * * * *

UNITED STATES PATENT AND TRADEMARK OFFICE
CERTIFICATE OF CORRECTION

PATENT NO. : 5,320,933

DATED : June 14, 1994

INVENTOR(S) : Lundy, et al

It is certified that error appears in the above-identified patent and that said Letters Patent is hereby corrected as shown below:

At column 3, line 1, "Chd 1-$C_8$" should be --$C_1$-$C_8$--.

At column 5, line 31, "Chd 1-$C_8$" should be --$C_1$-$C_8$--.

At column 7, line 18, "containing" should be --further contains--.

Signed and Sealed this

Twenty-seventh Day of September, 1994

Attest:

BRUCE LEHMAN

Attesting Officer

Commissioner of Patents and Trademarks